United States Patent
Izumi et al.

[11] Patent Number: 5,927,306
[45] Date of Patent: Jul. 27, 1999

[54] ULTRASONIC VIBRATOR, ULTRASONIC CLEANING NOZZLE, ULTRASONIC CLEANING DEVICE, SUBSTRATE CLEANING DEVICE, SUBSTRATE CLEANING TREATMENT SYSTEM AND ULTRASONIC CLEANING NOZZLE MANUFACTURING METHOD

[75] Inventors: Akira Izumi, Kyoto; Tetsuo Kawakatsu, Shiga, both of Japan

[73] Assignee: Dainippon Screen Mfg. Co., Ltd., Japan

[21] Appl. No.: 08/972,780

[22] Filed: Nov. 18, 1997

[30] Foreign Application Priority Data

Nov. 25, 1996 [JP] Japan ................................. 8-313766(P)

[51] Int. Cl.⁶ ........................................................ B08B 3/10
[52] U.S. Cl. ........................... 134/155; 134/184; 134/198; 239/102.2
[58] Field of Search ..................................... 134/198, 184, 134/186, 155, 172, 181, 201; 239/DIG. 12, 102.2; 310/324

[56] References Cited

U.S. PATENT DOCUMENTS

| | | |
|---|---|---|
| 2,949,900 | 8/1960 | Bodine . |
| 2,980,123 | 4/1961 | Lemelson ................................. 134/184 |
| 3,400,892 | 9/1968 | Ensmiger . |
| 4,117,057 | 9/1978 | Yajima et al. . |
| 4,326,553 | 4/1982 | Hall ......................................... 134/184 |
| 4,546,920 | 10/1985 | Torgersen . |
| 4,732,325 | 3/1988 | Jensen et al. ...................... 239/DIG. 19 |
| 4,804,007 | 2/1989 | Bran ........................................ 134/184 |
| 4,998,549 | 3/1991 | Bran ........................................ 134/184 |
| 5,037,481 | 8/1991 | Bran . |
| 5,158,101 | 10/1992 | Sakka .............................. 239/DIG. 19 |
| 5,244,154 | 9/1993 | Bucholz et al. .................. 239/DIG. 19 |
| 5,326,035 | 7/1994 | Ohmi et al. ....................... 239/DIG. 19 |
| 5,368,054 | 11/1994 | Koretsky et al. ........................ 134/184 |
| 5,383,483 | 1/1995 | Shibano .................................. 134/184 |
| 5,464,157 | 11/1995 | Bourdoulous et al. .......... 239/DIG. 19 |
| 5,585,044 | 12/1996 | Kawakami et al. ......................... 261/1 |
| 5,625,249 | 4/1997 | Grant ....................................... 134/184 |
| 5,637,815 | 6/1997 | Takahata et al. ................ 239/DIG. 19 |
| 5,698,036 | 12/1997 | Ishii et al. . |

FOREIGN PATENT DOCUMENTS

| | | | |
|---|---|---|---|
| 53-31289 | 3/1978 | Japan .............................. 239/DIG. 19 |
| 4-67616 | 3/1992 | Japan ..................................... 134/902 |
| 4-206725 | 7/1992 | Japan ..................................... 134/902 |
| 5-129266 | 5/1993 | Japan ..................................... 134/184 |

*Primary Examiner*—Frankie L. Stinson
*Attorney, Agent, or Firm*—Ostrolenk, Faber, Gerb & Soffen, LLP

[57] ABSTRACT

An ultrasonic cleaning nozzle comprises an ultrasonic vibrator, a case body and a nozzle cap. A chemical liquid supplied from a supply port is irradiated with ultrasonic waves by the ultrasonic vibrator, and thereafter sprayed from a spray port. The ultrasonic waves linearly advance in the chemical liquid, strike an inner wall of the nozzle cap, reflect and thereafter spray from the spray port with the chemical liquid. An ultrasonic wave irradiation surface of the ultrasonic vibrator and the inner wall of the nozzle cap are coated with high-purity SiC. The parts of the nozzle which are in contact with the chemical liquid and are struck by the ultrasonic waves have resistance against the ultrasonic waves and are corrosion resistant against the chemical liquid.

10 Claims, 5 Drawing Sheets

ULTRASONIC VIBRATOR, ULTRASONIC CLEANING NOZZLE, ULTRASONIC CLEANING DEVICE, SUBSTRATE CLEANING DEVICE, SUBSTRATE CLEANING TREATMENT SYSTEM AND ULTRASONIC CLEANING NOZZLE MANUFACTURING METHOD

BACKGROUND OF THE INVENTION

1. Field of the Invention

The present invention relates to an ultrasonic vibrator for providing ultrasonic waves to a chemical liquid, an ultrasonic cleaning nozzle and an ultrasonic cleaning device to which the ultrasonic vibrator is applied, a substrate treatment device and a substrate treatment system for performing a cleaning treatment on a thin plate type substrate (hereinafter referred to as a "substrate") such as a semiconductor substrate or a liquid crystal glass substrate through the ultrasonic cleaning nozzle. The invention is also related to a method of manufacturing the ultrasonic vibrator.

2. Description of the Background Art

In general, ultrasonic cleaning is known to be a cleaning technique for quickly and reliably removing contaminants adhering to a surface of a cleaned object. While a number of techniques are known for this type of ultrasonic cleaning, a broadly accepted ultrasonic cleaning device includes an ultrasonic vibrator which is set into a cleaning reservoir, having a cleaning solution therein, for irradiating the cleaning solution with ultrasonic waves or the like. The advantage of the ultrasonic cleaning resides in that it is possible to readily and quickly clean a cleaned object having a complicated shape by simply dipping the same in the cleaning solution.

The aforementioned substrate may be assembled into a product through various treatments, where a cleaning treatment for removing particles or the like adhering to the substrate surface is one of the more important steps among the treatment steps. Known devices for performing cleaning treatments for substrates are batch type cleaning devices for simultaneously cleaning plurality of substrates and sheet-fed type cleaning devices for successively cleaning a single substrate.

The ultrasonic cleaning technique may be employed by these substrate cleaning devices for effective cleaning. In case of applying to the ultrasonic cleaning technique is used in the batch type cleaning device, an ultrasonic vibrator is mounted on a cleaning reservoir as described above. However, when the ultrasonic cleaning technique is used in the sheet-fed type cleaning device, an ultrasonic cleaning nozzle having an ultrasonic vibrator therein is used for applying the ultrasonic cleaning. This ultrasonic cleaning nozzle is adapted to irradiate a cleaning solution flowing therein with ultrasonic waves and spray the cleaning solutions onto the substrate.

Known cleaning solutions employed for the aforementioned cleaning of substrates include various chemical liquids in addition to de-ionized water. When a chemical liquid is used as a cleaning solution, various problems arise. While the ultrasonic cleaning nozzle is usually prepared by combining a metal material with resin, the metal material is inferior in corrosion resistance against the chemical liquid and an eluted metal contaminates the substrate. The metal portion of the cleaning nozzle, however, is hardly deformed by ultrasonic vibration and has sufficient resistance against the ultrasonic vibration. On the other hand, the resin portion of the nozzle generates heat or is deformed by ultrasonic vibration, while the resin is excellent in corrosion resistance against the chemical liquid.

When certain ceramic materials are used for the ultrasonic cleaning nozzle, impurities contained in the ceramics are eluted by the chemical liquid and contaminate the substrate. Therefore, neither metal, resin nor certain ceramics are desirable for use as an ultrasonic cleaning nozzle.

In the batch type cleaning device, similar problems arise and, hence, the treatment must be performed by providing an inner reservoir filled with the chemical liquid. The ultrasonic vibrator is disposed inside the reservoir thereby reducing the efficiency of the cleaning treatment due to the damping of the ultrasonic waves by the inner reservoir.

SUMMARY OF THE INVENTION

The present invention is directed to an ultrasonic vibrator connected to an ultrasonic oscillator for providing ultrasonic waves to a chemical liquid.

According to the present invention, the ultrasonic vibrator comprises: (a) an ultrasonic vibrator body for generating ultrasonic vibration; and (b) a contact surface defined on a surface of the ultrasonic vibrator body, being in contact with the chemical liquid. In the ultrasonic vibrator of the present invention, the contact surface is made of a material selected among high-purity SiC, high-purity $Al_2O_3$ and high-purity quartz.

The ultrasonic vibrator of the present invention has resistance against ultrasonic waves, corrosion resistance against the chemical liquid, and there is no possibility that the chemical liquid is contaminated by eluted impurities.

The present invention is also directed to an ultrasonic cleaning nozzle providing ultrasonic waves to a chemical liquid and spraying an object to be cleaned with the chemical liquid for cleaning the object.

According to the present invention, the ultrasonic cleaning nozzle comprises: (a) a casing for defining a channel for passage of the chemical liquid; (b) an ultrasonic vibrator for providing ultrasonic waves to the chemical liquid passing through the channel, which comprises (b-1) an ultrasonic vibrator body for generating ultrasonic vibration; and (b-2) a contact surface defined on a surface of the ultrasonic vibrator body, being in contact with the chemical liquid, and (c) a nozzle tip for spraying the object to be cleaned with the chemical liquid after passing through the channel. The nozzle tip comprises an inner wall against which the ultrasonic waves provided to the chemical liquid strike. In the ultrasonic cleaning nozzle of the present invention, the contact surface and the inner wall are each made of a material selected among high-purity SiC, high-purity $Al_2O_3$ and high-purity quartz.

The present invention is further directed to an ultrasonic cleaning device for irradiating an object being dipped in a prescribed chemical liquid with ultrasonic waves for cleaning the object.

The present invention is still directed to a device for cleaning a substrate.

An object of the present invention is to provide an ultrasonic vibrator, an ultrasonic cleaning nozzle, an ultrasonic cleaning device and a substrate cleaning device which have resistance against ultrasonic waves, corrosion resistance against a chemical liquid and do not contaminate the object to be cleaned during cleaning when the chemical liquid is used as a treatment solution.

These and other objects, features, aspects and advantages of the present invention will become more apparent from the

DESCRIPTION OF THE PREFERRED EMBODIMENTS

An embodiment of the present invention is now described in detail with reference to the drawings.

Figure 1:
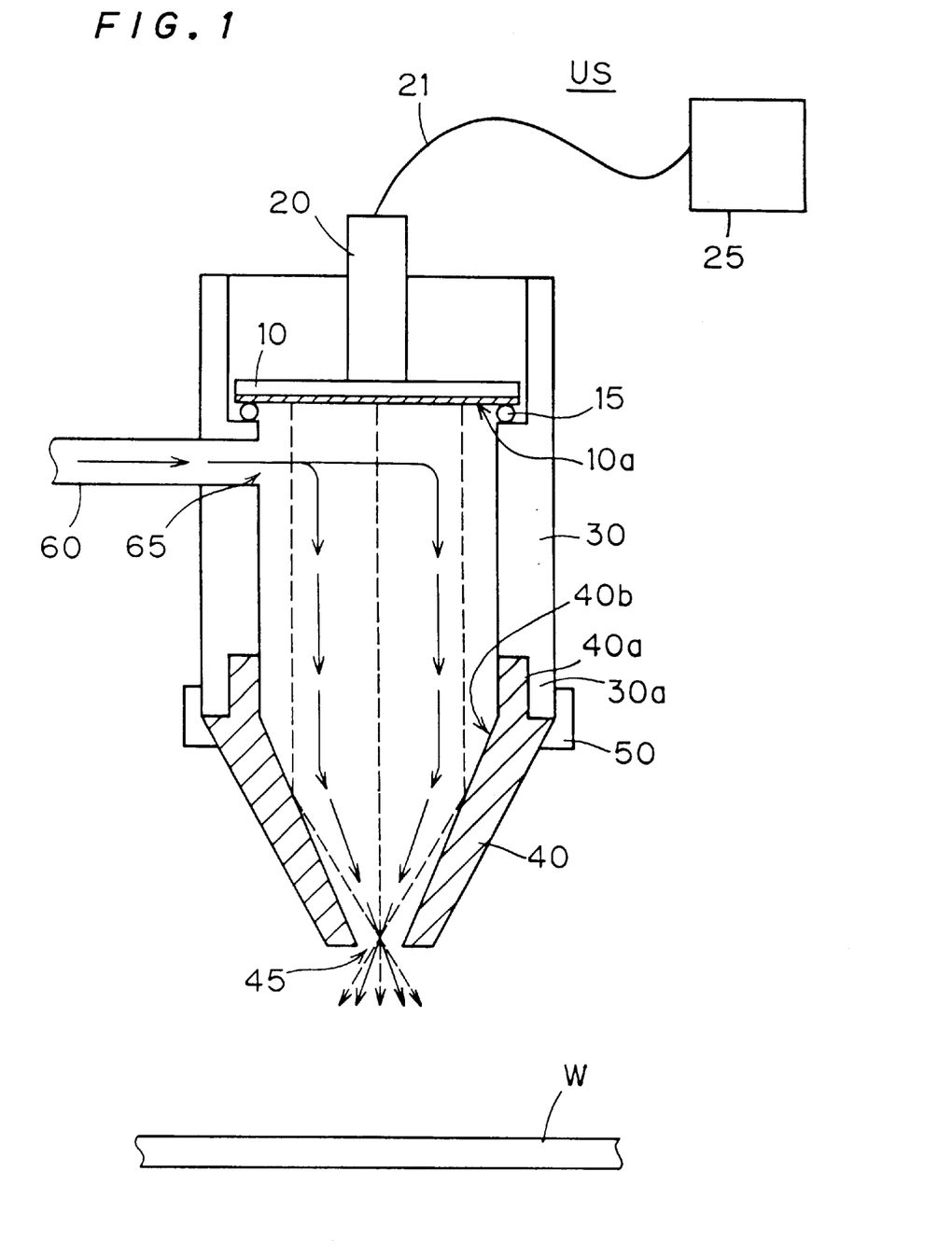
FIG. 1 is a schematic sectional view showing an ultrasonic cleaning nozzle according to the present invention.

FIG. 1 is a schematic sectional view of an ultrasonic cleaning nozzle US according to the present invention. This ultrasonic cleaning nozzle US comprises a nozzle cap 40, a case body 30, and an ultrasonic vibrator 10.

The ultrasonic vibrator 10 is electrically connected with an ultrasonic oscillator 25 provided exterior to the nozzle, and is used for irradiating a chemical liquid flowing in the ultrasonic cleaning nozzle US with ultrasonic waves of the megahertz band. The ultrasonic oscillator 25 generates an electric signal which is transmitted to the ultrasonic vibrator 10 through a cable 21 and a conduit 20. The ultrasonic vibrator 10 irradiates the chemical liquid with ultrasonic waves in response to this electric signal. The ultrasonic vibrator 10 is fixed to the case body 30 via an O ring 15, which prevents the chemical liquid from leaking upward beyond the ultrasonic vibrator 10.

The nozzle cap 40, which is a conical member, is connected to a lower portion of the case body 30, which case body is made of polypropylene. This nozzle cap 40 is detachably fixed to the case body 30 by a resin connecting member 50. The nozzle cap 40 and the case body 30 may be detachable via a cap engaging portion 40a and a body engaging portion 30a. These portions may be connected with each other by a screw mechanism, for example.

The case body 30 is connected to a supply pipe 60, which supplies the chemical liquid for cleaning. For convenience of illustration, FIG. 1 shows the flow of the chemical liquid in the ultrasonic cleaning nozzle US by arrows having solid lines. The chemical liquid supplied from the supply pipe 60 flows into the case body 30 through a supply port 65, is irradiated with ultrasonic waves of the megahertz band by the ultrasonic vibrator 10, and thereafter flows toward the lower portion of the case body 30 to be sprayed onto a substrate W from a spray port 45 of the nozzle cap 40.

In the ultrasonic cleaning nozzle US, the ultrasonic waves emitted from the ultrasonic vibrator 10 advance in the chemical liquid as shown by arrows having dotted lines in FIG. 1. The ultrasonic waves applied in this embodiment are at a high frequency in the megahertz band and substantially linearly advance as shown in FIG. 1. Thus, the ultrasonic waves emitted from the ultrasonic vibrator 10 advance substantially in parallel with an inner wall surface of the case body 30, then strike an inner wall 40b of the nozzle cap 40, reflect off the inner wall 40b, and thereafter discharge from the spray port 45 with the chemical liquid.

The inner wall 40b of the nozzle cap 40, i.e., the part which is in contact with the chemical liquid and struck by the ultrasonic waves, made of high-purity SiC. An ultrasonic wave emitting surface 11a of the ultrasonic vibrator 10, which is influenced by both the chemical liquid and the ultrasonic waves, is also made of high-purity SiC. The high-purity SiC is not corroded by the chemical liquid, causes no elution of impurities, generates no heat, and is not deformed by the ultrasonic waves. The purity of the high-purity SiC having such characteristics is preferably at least 96.0 wt. %, and most preferably at least 98.5 wt. %.

In order to prepare the inner wall 40b of the nozzle cap 40 from high-purity SiC, a base material for the nozzle cap 40 is first formed by sintered SiC. Since a sintering assistant is added for the purpose of grain bonding, the sintered SiC is inferior in purity, and elutes impurities when coming into contact with the chemical liquid. Therefore, the surface of the base material of sintered SiC is coated with high-purity SiC by chemical vapor deposition (hereinafter referred to as "CVD").

The ultrasonic wave emitting surface 10a of the ultrasonic vibrator 10 is also prepared by coating a surface of a blase material of sintered SiC with high-purity SiC by CVD. The surface 10a is then fixed to the ultrasonic vibrator 10 with an adhesive or the like.

Thus, the parts of the ultrasonic cleaning nozzle US which are in contact with the chemical liquid and influenced by the ultrasonic waves are made of high-purity SiC having a resistance against the ultrasonic waves and corrosion resistance against the chemical liquid. Indeed, there is no possibility that the chemical liquid is contaminated by eluted impurities from the high-purity SiC.

While it has been described that the surfaces of the base materials of sintered SiC are coated with high-purity SiC by CVD the present invention is not restricted to the aforementioned method so long as the parts which are in contact with the chemical liquid and influenced by the ultrasonic waves are made of high-purity SiC. For example, the nozzle cap 40 and the ultrasonic wave emitting surface 10a made of high-purity SiC may be integrally formed. However, the parts prepared by coating the surfaces of the base materials of sintered SiC with high-purity SiC by CVD in the aforementioned manner are superior in strength. Further, the base materials of sintered SiC may be replaced with those of graphite, so that the graphite base materials are coated with high-purity SiC by CVD.

Further, the material for the case body 30 is not restricted to polypropylene but may be prepared from a resin material having chemical resistance such as PVDF (polyvinylidene fluoride resin) or PTFE (polytetrafluoroethylene resin), for example. In addition, the material for the case body 30 is not restricted to resin but may be prepared from the aforementioned high-purity SiC.

Figure 2:
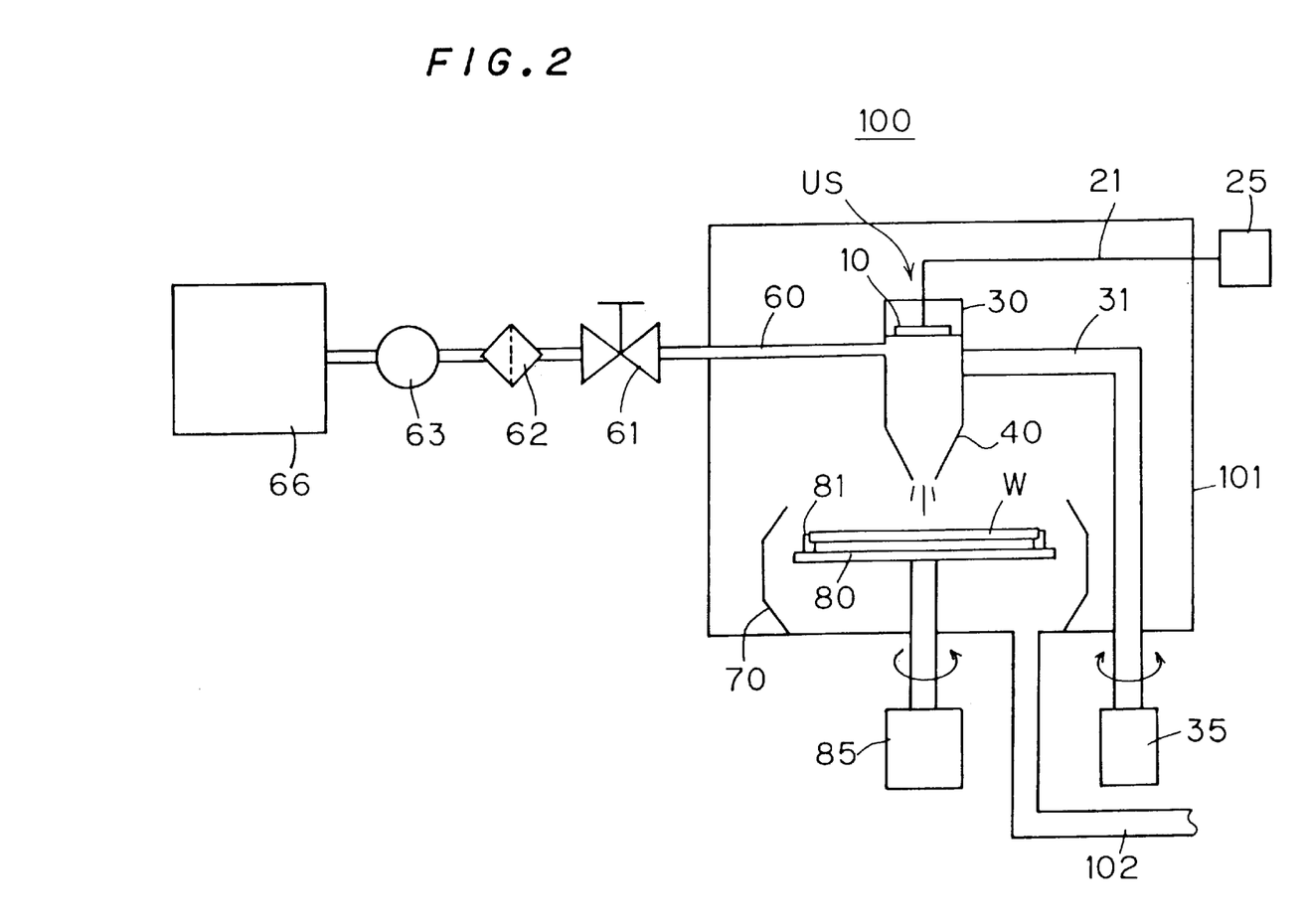
FIG. 2 is a model diagram showing the structure of a substrate cleaning device to which the ultrasonic cleaning nozzle of FIG. 1 is applied.

A substrate cleaning device to which the aforementioned ultrasonic cleaning nozzle US is applied is now described. FIG. 2 is a model diagram showing the structure of a substrate cleaning device 100 to which the ultrasonic cleaning nozzle US is applied.

In the substrate cleaning device 100, a substrate W is supported by a substrate support member 81 which is set on an upper surface of a turntable 80. The turntable 80 is rotated/driven by a motor 85 so that a chemical liquid irradiated with ultrasonic waves is sprayed onto this substrate W from the ultrasonic cleaning nozzle US for cleaning the same. This cleaning treatment is performed in an outer chamber 101. A cleaning cup 70 is arranged in the outer chamber 101 for covering the outer peripheral edge portion of the substrate W and collecting the chemical liquid scattered from the substrate W during the cleaning treatment. The collected chemical liquid is discharged to the exterior of the device from a discharge pipe 102 provided on the outer chamber 101.

The chemical liquid supplied to the ultrasonic cleaning nozzle US is stored in a chemical liquid tank 66. The chemical liquid employed in the substrate cleaning device 100 can be selected from various cleaning solutions, such as an $NH_4OH$—$H_2O_2$—$H_2O$ mixed solution (hereinafter referred to as an "SC-1 solution"), an $O_3$—$H_2O$ solution (hereinafter referred to as "ozonic water") and the like. During the cleaning treatment, the chemical liquid is fed by a pump 63, passed through a filter 62 and a valve 61, and thereafter supplied to the case body 30 of the ultrasonic cleaning nozzle US from the supply pipe 60. The chemical liquid supplied to the case body 30 is irradiated with ultrasonic waves by the ultrasonic vibrator 10 and sprayed onto the substrate W from the nozzle cap 40, as hereinabove described.

The ultrasonic cleaning nozzle US is connected to a pulse motor 35 through a support arm and is rotated and is rotated to clean the overall surface of the substrate W during the cleaning treatment. Further, the outer chamber 101 of the substrate cleaning device 100 is provided with a nozzle for de-ionized water and a nozzle for chemical liquid (not shown). These nozzles do not employ ultrasonic waves when directing the de-ionized water and chemicals to a portion of the substrate W close to the rotation center. Thus the de-ionized water and chemicals clean a portion close to the rotation center of the substrate W, which portion has weak centrifugal force.

While FIG. 2 shows only one chemical liquid tank 66, two or more such chemical liquid tanks may be provided for using different chemical liquids in a mixed state or successively using the same.

Various combinations of treatment steps are possible when performing the cleaning treatment in the aforementioned substrate cleaning device 100. One such combination of steps includes performing ultrasonic cleaning on the substrate W with the SC-1 solution, rinsing the substrate W with, ultrasonically de-ionized water cleaning the substrate W with the ozonic water, rinsing the substrate W with de-ionized water again, and finally stopping the spraying of the substrate with treatment solution (both the chemical liquid and the de-ionized water) from the nozzle so that only rotation of the substrate W is performed for spin drying.

Figure 3:
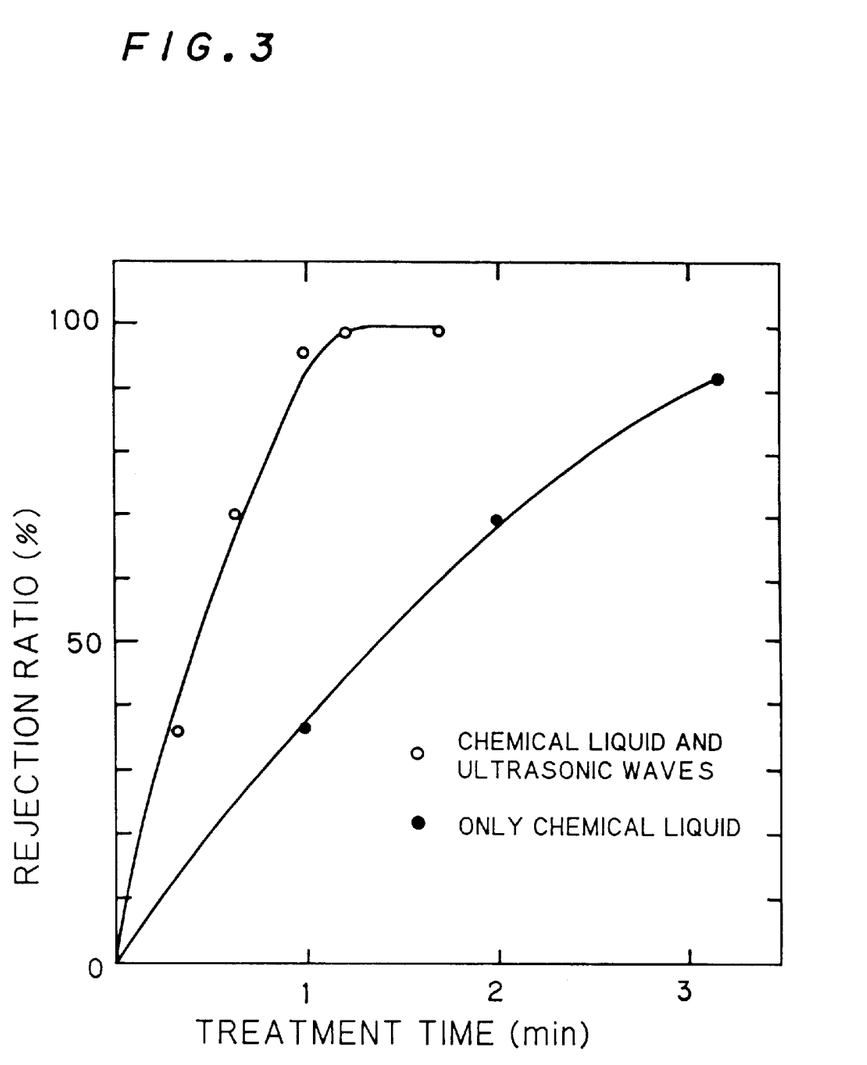
FIG. 3 is a diagram illustrating the effects of ultrasonic cleaning in the substrate cleaning device of FIG. 2.

FIG. 3 is a diagram showing the effects of the ultrasonic cleaning in the substrate cleaning device 100. This figure shows rejection ratios in case of sticking 3000 to 4000 grains of $Si_3N_4$ to the substrate W and cleaning the same. Referring to the figure, black circles show cleaning with only the chemical liquid, and white circles show the case of employing both chemical liquid cleaning and ultrasonic cleaning. As clearly understood from FIG. 3, the treatment is more quickly, efficiently and effectively performed when both chemical liquid cleaning and ultrasonic cleaning are employed. Further, a better cleaning effect is attained when both chemical liquid cleaning and ultrasonic cleaning are employed at the same time. In addition, the consumption of the chemical liquid is reduced when the treatment time is reduced by employing both chemical liquid cleaning and ultrasonic cleaning.

In the ultrasonic cleaning nozzle US of the substrate cleaning device 100, the parts which are in contact with the chemical liquid and influenced by the ultrasonic waves are made of high-purity SiC, whereby the chemical liquid is not contaminated by eluted impurities but cleanliness of the substrate W can be maintained.

Figure 4:
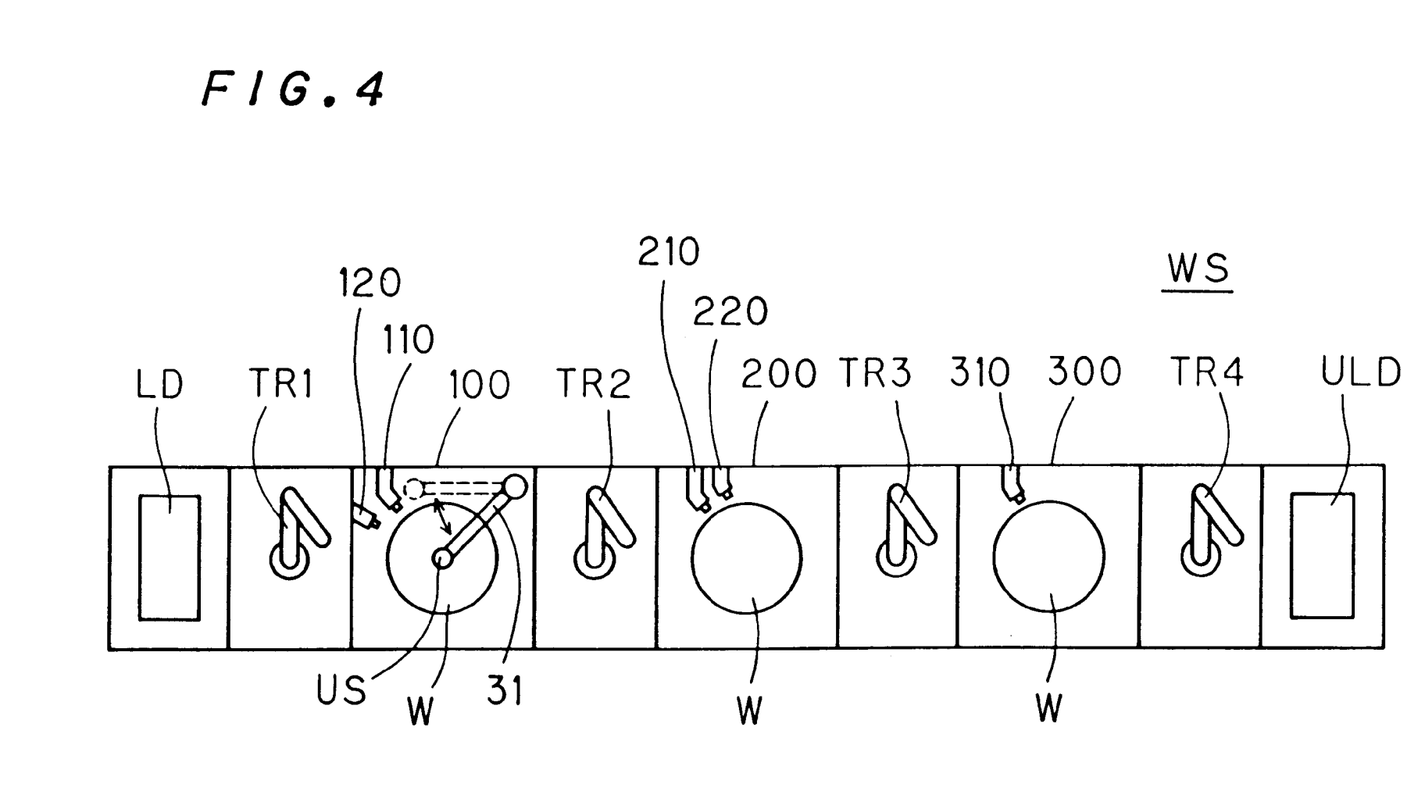
FIG. 4 is a model diagram showing the structure of a substrate cleaning treatment system having the substrate cleaning device of FIG. 2.

A substrate cleaning treatment system WS having the aforementioned substrate cleaning device 100 built therein is now described with reference to FIG. 4.

The substrate cleaning treatment system WS comprises a loader LD for introducing substrates W, substrate transfer arms TR1, TR2, TR3 and TR4 for transferring the substrates W by bending and stretching arms having joints, substrate cleaning devices 100, 200 and 300, and an unloader ULD for discharging the substrates W.

Each substrate W introduced from the loader LD is first transferred to the substrate cleaning device 100 by the substrate transfer arm TR1. The substrate cleaning device 100 comprises the ultrasonic cleaning nozzle US, a de-ionized water cleaning nozzle 110, and a chemical liquid cleaning nozzle 120, as hereinabove described. The chemical liquid cleaning nozzle 120, which emits no ultrasonic waves, is set such that its chemical liquid contact point is in the vicinity of the rotation center of the substrate W.

In the substrate cleaning device 100, the substrate W is rotated and subjected to chemical liquid cleaning by the ultrasonic cleaning nozzle US and the chemical liquid cleaning nozzle 120. During the chemical liquid cleaning treatment, the ultrasonic cleaning nozzle US is rotated by the support arm 31. After the chemical liquid cleaning treatment, the de-ionized water cleaning nozzle 110 performs de-ionized water rinsing. While the chemical liquid employed in the substrate cleaning device 100 can be selected from a group of arbitrary substrate cleaning chemical liquids (such as the aforementioned SC-1 solution and ozonic water, for example), it is desirable to employ a chemical liquid which requires a longest treatment time in a conventional substrate cleaning treatment system.

The substrate W, having been completely cleaned in the substrate cleaning device 100, is then transferred from the substrate cleaning device 100 to the substrate cleaning device 200 by the substrate transfer arm TR2. This substrate cleaning device 200 comprises a de-ionized water cleaning nozzle 210 and a chemical liquid cleaning nozzle 220. The chemical liquid cleaning nozzle 220 irradiates a chemical liquid with no ultrasonic waves.

In the substrate cleaning device 200, the substrate W is subjected to chemical liquid cleaning by the chemical liquid sprayed from the chemical liquid cleaning nozzle 220, and is subjected to de-ionized water rinsing by de-ionized water sprayed from the de-ionized water cleaning nozzle 210. While the chemical liquid employed in the substrate cleaning device 200 can be selected from a group of arbitrary substrate cleaning chemical liquids, the liquid having a relatively short treatment time as compared with the chemical liquid employed in the substrate cleaning device 100 is preferable.

The substrate W, having been completely cleaned in the substrate cleaning device 200, is then transferred from this substrate cleaning device 200 to the substrate cleaning device 300 by the substrate transfer arm TR3. The substrate cleaning device 300 comprises a de-ionized water cleaning nozzle 310 and performs de-ionized water rinsing on the substrate W as a final step. Thereafter, the de-ionized water spraying from the de-ionized water cleaning nozzle 310, is stopped and spin-drying the substrate W is commensed.

Finally, the substrate W, is having been completely cleaned in the substrate cleaning device 300, is then transferred to the unloader ULD by the substrate transfer arm TR4 and discharged from the unloader ULD.

In the aforementioned substrate cleaning treatment system WS, the chemical liquid treatment which has generally required a long time to accomplish is performed in the substrate cleaning device 100. Ultrasonic cleaning can be added to this chemical liquid treatment and hence the cleaning time is reduced. Therefore, time in the overall substrate cleaning treatment system WS is also reduced and the treatment efficiency is improved.

Figure 5:
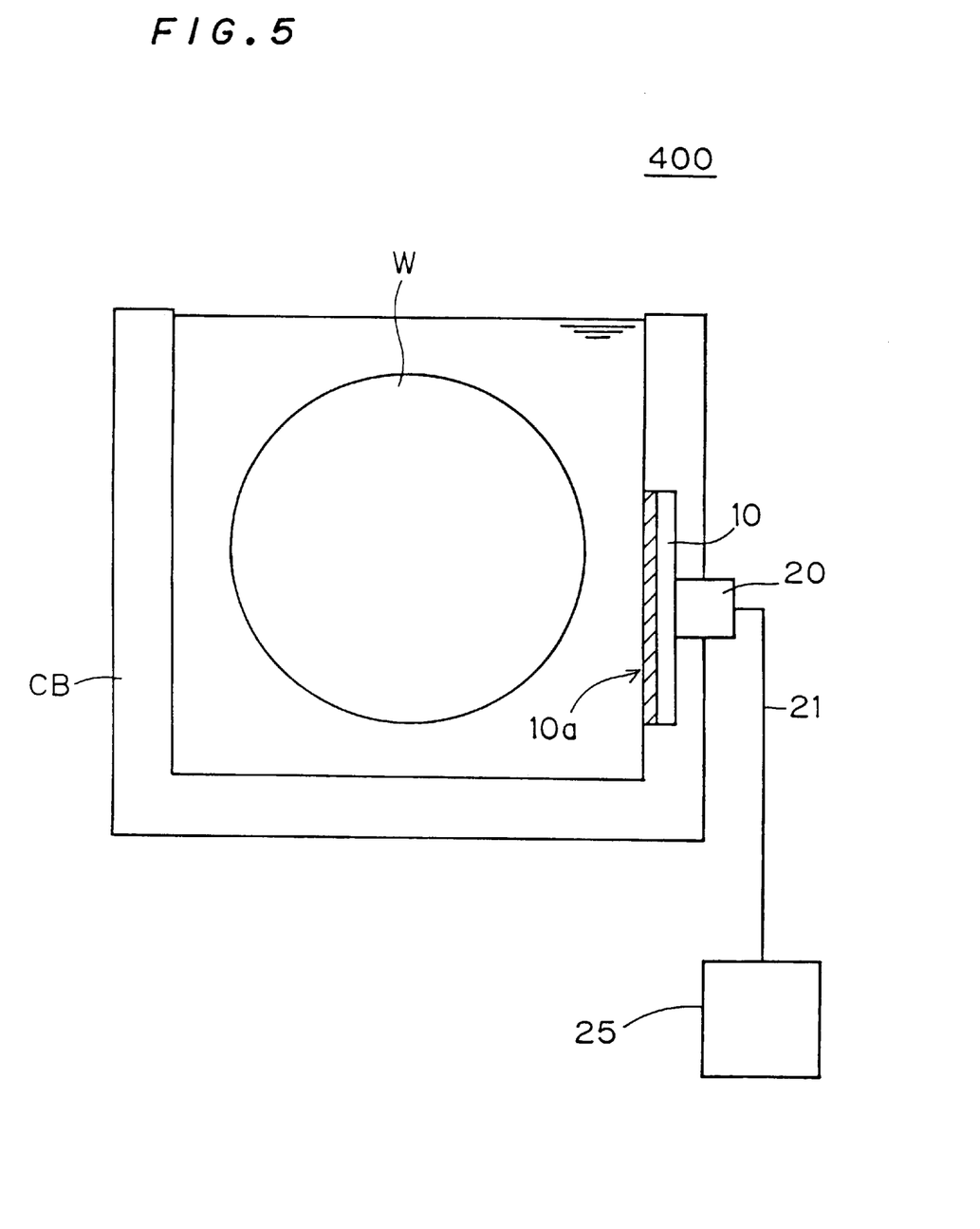
FIG. 5 is a schematic sectional view showing a batch type cleaning device to which an ultrasonic vibrator according to the present invention is applied.

The ultrasonic vibrator 10 according to the present invention is applicable not only to the ultrasonic cleaning nozzle US but to a batch type cleaning device. FIG. 5 is a schematic sectional view showing a batch type cleaning device 400 to which the ultrasonic vibrator 10 is applied.

The batch type cleaning device 400 comprises a chemical liquid reservoir CB and the ultrasonic vibrator 10. The chemical liquid reservoir CB is made of a material, such as resin, for example, having corrosion resistance against chemicals. The ultrasonic vibrator 10, which is substantially identical to that employed for the ultrasonic cleaning nozzle US described with reference to FIG. 1, is disposed on a wall of the chemical liquid reservoir CB.

In the batch type cleaning device 400, a plurality of substrates W are dipped in the chemical liquid reservoir CB, which has been filled with a chemical liquid, so that the ultrasonic vibrator 10 irradiates the substrates W with ultrasonic waves and facilitates cleaning with the chemical liquid.

The aforementioned batch type cleaning device 400 has a resistance to ultrasonic waves and a resistance to chemical corrosion. Further, the cleaning device 400 employs the ultrasonic vibrator 10 which is resistant to chemical corrosion and, therefore, no cleaned objects are contaminated during cleaning and cleanliness of the substrates W can be maintained. Further, no inner reservoir is provided in the chemical liquid reservoir CB and the ultrasonic waves act on the substrates W with no damping, the treatment time is reduced and the treatment efficiency is improved.

While specific embodiments of the present invention have been described, the present invention is not restricted to the aforementioned embodiments. While only one substrate cleaning device 100 comprising the ultrasonic cleaning nozzle US is provided in the substrate cleaning treatment system WS shown in FIG. 4, for example, two or more such devices may be provided as needed. Further, different responses to the treatments are possible by changing the number and the order of the substrate cleaning devices 100, 200 and 300 in the substrate cleaning treatment system WS.

While the batch type cleaning device 400 in FIG. 5 is adapted to clean the substrates W, it is also possible to clean objects other than substrates by employing this batch type cleaning device 400.

While a high-purity SiC, ceramic is formed on the contact surface of the ultrasonic vibrator (which is in contact with the chemical liquid in this embodiment) high-purity $Al_2O_3$ (alumina) of at least 92 wt. % in purity may be employed in place of the high-purity SiC. In case of employing $Al_2O_3$, it is most preferable to employ of $Al_2O_3$ at least 99.9 wt. %, in purity.

When employing a chemical liquid other than hydrofluoric acid, it is also possible to employ high-purity quartz in place of the high-purity SiC. In this case, the purity of the quartz is preferably at least 99.980 wt. %, and most preferably at least 99.995 wt. %.

While the invention has been shown and described in detail, the foregoing description is in all aspects illustrative and not restrictive. It is therefore understood that numerous modifications and variations can be devised without departing from the scope of the invention.

We claim:

1. An ultrasonic cleaning nozzle providing ultrasonic waves to a chemical liquid and spraying an object to be cleaned with said chemical liquid for cleaning said object, said nozzle comprising:

a casing for defining a channel for passage of said chemical liquid;

an ultrasonic vibrator for providing ultrasonic waves to said chemical liquid passing through said channel, said ultrasonic vibrator including:

an ultrasonic vibrator body for generating ultrasonic vibration; and a contact surface disposed on said ultrasonic vibrator body, said contact surface being in contact with said chemical liquid; and a nozzle tip for spraying said object to be cleaned with said chemical liquid after passing through said channel, said nozzle tip having an inner wall against which said ultrasonic waves provided to said chemical liquid strike, wherein said contact surface is made of a material selected from the group consisting of high purity SiC and high purity quartz and said inner wall is made of a material selected from the group consisting of high-purity SiC, high-purity $Al_2O_3$ and high-purity quartz.

2. The ultrasonic cleaning nozzle of claim 1, wherein said contact surface and said inner wall are each made of high-purity SiC having a purity of not less than 96.0 wt. %.

3. The ultrasonic cleaning nozzle of claim 1, wherein said nozzle tip is detachable from said casing.

4. A device for cleaning a substrate, comprising:

chemical liquid supply means for supplying a chemical liquid; and an ultrasonic nozzle supplied with said chemical liquid by said chemical liquid supply means, for spraying said substrate with said chemical liquid, said nozzle including:

a casing for defining a channel for passage of said chemical liquid;

an ultrasonic vibrator for providing ultrasonic waves to said chemical liquid passing through said channel, said ultrasonic vibrator including:

an ultrasonic vibrator body for generating ultrasonic vibration; and a contact surface disposed on said ultrasonic vibrator body, said contact surface being in contact with said chemical liquid; and a nozzle tip for spraying said substrate with said chemical liquid after passing through said channel, said nozzle tip having an inner wall against which said ultrasonic waves provided to said chemical liquid strike, wherein said contact surface is made of a material selected from the group consisting of high purity SiC and high purity quartz and said inner wall is made of a material selected from the group consisting of high-purity SiC, high-purity $Al_2O_3$ and high-purity quartz.

5. The device of claim 4, further comprising de-ionized-water cleaning means for spraying said substrate with de-ionized water for cleaning said substrate with said de-ionized water.

6. An ultrasonic cleaning nozzle for imparting ultrasonic vibrations to a liquid and directing said liquid toward an object to be cleaned, said nozzle comprising:
   a case having an interior surface defining an interior space, said interior surface including a contact portion being formed of a material taken from the group consisting of: SiC having a purity of not less than about 96.0 percent by weight; $Al_2O_3$ having a purity of not less than about 92 percent by weight; and quartz having a purity of not less than about 99.98 percent by weight; and
   an ultrasonic vibrator operatively coupled to said case, said vibrator being adapted to vibrate at ultrasonic frequencies and including a contact surface for contacting and imparting said vibrations to said liquid, said contact surface being formed of a material taken from the group consisting of: SiC having a purity of not less than about 96.0 percent by weight and quartz having a purity of not less than about 99.98 percent by weight.

7. The ultrasonic cleaning nozzle of claim 6, wherein at least one of said contact portion of said case and said contact surface of said ultrasonic vibrator is formed of SiC having a purity of not less than about 98.5 percent by weight.

8. The ultrasonic cleaning nozzle of claim 6, wherein at least one of said contact portion of said case and said contact surface of said ultrasonic vibrator is formed of quartz having a purity of not less than about 99.995 percent by weight.

9. An ultrasonic cleaning nozzle providing ultrasonic waves to a chemical liquid and spraying an object to be cleaned with said chemical liquid for cleaning said object, said nozzle comprising:
   a casing for defining a channel for passage of said chemical liquid;
   an ultrasonic vibrator for providing ultrasonic waves to said chemical liquid passing through said channel, said ultrasonic vibrator including:
      an ultrasonic vibrator body for generating ultrasonic vibration; and
      a contact surface disposed on said ultrasonic vibrator body, said contact surface being in contact with said chemical liquid; and
   a nozzle tip for spraying said object to be cleaned with said chemical liquid after passing through said channel, said nozzle tip having an inner wall against which said ultrasonic waves provided to said chemical liquid strike,
   wherein said contact surface is made of a material selected from the group consisting of high purity SiC and high purity quartz.

10. A device for cleaning a substrate, comprising:
   chemical liquid supply means for supplying a chemical liquid; and
   an ultrasonic nozzle supplied with said chemical liquid by said chemical liquid supply means, for spraying said substrate with said chemical liquid, said nozzle including:
      a casing for defining a channel for passage of said chemical liquid;
      an ultrasonic vibrator for providing ultrasonic waves to said chemical liquid passing through said channel, said ultrasonic vibrator including:
         an ultrasonic vibrator body for generating ultrasonic vibration; and
         a contact surface disposed on said ultrasonic vibrator body, said contact surface being in contact with said chemical liquid; and
      a nozzle tip for spraying said substrate with said chemical liquid after passing through said channel, said nozzle tip having an inner wall against which said ultrasonic waves provided to said chemical liquid strike,
   wherein said contact surface is made of a material selected from the group consisting of high purity SiC and high purity quartz.

* * * * *